(12) United States Patent
Lin

(10) Patent No.: US 10,433,464 B1
(45) Date of Patent: Oct. 1, 2019

(54) AIR DUCT FOR COOLING A REAR-MOUNTED SWITCH IN A RACK

(71) Applicant: ZT Group Int'l, Inc., Secaucus, NJ (US)

(72) Inventor: Ting Yu Lin, Bloomfield, NJ (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 0 days.

(21) Appl. No.: 15/174,640

(22) Filed: Jun. 6, 2016

(51) Int. Cl.
*H05K 7/20* (2006.01)

(52) U.S. Cl.
CPC ..... *H05K 7/20745* (2013.01); *H05K 7/20145* (2013.01); *H05K 7/20736* (2013.01)

(58) Field of Classification Search
CPC ....... G06F 1/181–182; H05K 7/20218–20381; H05K 7/20409–20418; H05K 7/20009–202; H05K 7/20745; H05K 7/20145; H05K 7/20572; H05K 7/20736; H05K 7/20727; H01L 23/367–3677; H01L 23/473; H01L 23/46–467
USPC ...... 361/676–678, 679.46–679.54, 688–723; 165/80.1–80.5, 104.33, 185; 174/15.1–15.3, 16.1–16.3, 547, 548; 257/712–722, E23.088; 24/453, 458–459; 454/184; 312/236
See application file for complete search history.

(56) References Cited

U.S. PATENT DOCUMENTS

| | | | | |
|---|---|---|---|---|
| 6,142,590 A | * | 11/2000 | Harwell | G06F 1/16 312/208.1 |
| 7,730,738 B2 | * | 6/2010 | Park | F25D 17/062 62/407 |
| 8,659,895 B1 | * | 2/2014 | Carlson | H05K 7/20745 361/694 |
| 10,058,011 B2 | * | 8/2018 | Graczyk | H05K 7/20736 |
| 2001/0048590 A1 | * | 12/2001 | Behl | G11B 33/022 361/679.47 |
| 2003/0035268 A1 | * | 2/2003 | Coglitore | G06F 1/18 361/679.4 |
| 2005/0036287 A2 | * | 2/2005 | Kosugi | F04D 19/007 361/695 |
| 2005/0231915 A1 | * | 10/2005 | Keenan | H05K 7/20572 361/700 |
| 2005/0280986 A1 | * | 12/2005 | Coglitore | G06F 1/20 361/679.49 |
| 2006/0120045 A1 | * | 6/2006 | Van Der Werff | G06F 1/20 361/697 |
| 2006/0193114 A1 | * | 8/2006 | Faneuf | H05K 7/20809 361/689 |
| 2008/0037217 A1 | * | 2/2008 | Murakami | H05K 7/206 361/695 |
| 2008/0055846 A1 | * | 3/2008 | Clidaras | G06F 1/20 361/679.41 |
| 2008/0068791 A1 | * | 3/2008 | Ebermann | G06F 1/20 361/679.49 |

(Continued)

*Primary Examiner* — Robert J Hoffberg
*Assistant Examiner* — Razmeen Gafur
(74) *Attorney, Agent, or Firm* — Dergosits & Noah LLP; Todd A. Noah (57) ABSTRACT

A ducting apparatus, switch, and rack of electronic devices are disclosed in which the ducting apparatus is configured to convey air from a cold aisle at a first face of the rack to a side air inlet of the switch. The ducting apparatus also hinders or prevents exhaust air from the switch from reaching the cold aisle.

13 Claims, 5 Drawing Sheets

(56) References Cited

U.S. PATENT DOCUMENTS

| | | | |
|---|---|---|---|
| 2008/0151491 A1* | 6/2008 | Baldwin | H05K 7/20563 361/679.49 |
| 2008/0259563 A1* | 10/2008 | Fukuda | G06F 1/182 361/695 |
| 2009/0061755 A1* | 3/2009 | Calder | H05K 7/20572 454/184 |
| 2009/0122484 A1* | 5/2009 | Caveney | H05K 7/20572 361/692 |
| 2009/0190301 A1* | 7/2009 | Huang | H05K 7/20736 361/679.46 |
| 2009/0279253 A1* | 11/2009 | Musciano | H05K 7/20727 361/692 |
| 2009/0323282 A1* | 12/2009 | Holdredge | H05K 7/20145 361/694 |
| 2010/0003911 A1* | 1/2010 | Graczyk | H05K 7/20736 454/184 |
| 2010/0008025 A1* | 1/2010 | Nemoz | H05K 7/20563 361/678 |
| 2010/0027216 A1* | 2/2010 | Matsushima | H05K 7/20745 361/679.49 |
| 2010/0033687 A1* | 2/2010 | Utsunomiya | G03B 21/16 353/58 |
| 2010/0248609 A1* | 9/2010 | Tresh | H05K 7/20745 454/184 |
| 2011/0122573 A1* | 5/2011 | Peng | G06F 1/20 361/679.48 |
| 2011/0184568 A1* | 7/2011 | Tai | G05D 23/1934 700/282 |
| 2011/0242755 A1* | 10/2011 | Zeighami | F24F 11/0001 361/679.46 |
| 2012/0020013 A1* | 1/2012 | Li | G06F 1/20 361/679.47 |
| 2012/0044630 A1* | 2/2012 | Elwany | G06F 1/1601 361/679.47 |
| 2012/0049706 A1* | 3/2012 | Cottuli | H05K 7/20572 312/236 |
| 2012/0069514 A1* | 3/2012 | Ross | H05K 7/20727 361/679.33 |
| 2012/0113589 A1* | 5/2012 | Sporer | H05K 7/1404 361/679.54 |
| 2012/0113592 A1* | 5/2012 | Chen | H05K 7/1488 361/695 |
| 2012/0201002 A1* | 8/2012 | Schmitt | H05K 7/1488 361/692 |
| 2012/0201003 A1* | 8/2012 | Shimasaki | H05K 7/20736 361/695 |
| 2012/0243173 A1* | 9/2012 | Archibald | G06F 1/206 361/679.46 |
| 2012/0293951 A1* | 11/2012 | Jai | H05K 7/20727 361/679.53 |
| 2013/0250515 A1* | 9/2013 | Wu | H05K 7/20145 361/692 |
| 2014/0078668 A1* | 3/2014 | Goulden | H05K 7/20736 361/679.47 |
| 2014/0092541 A1* | 4/2014 | Zhang | G06F 1/20 361/679.5 |
| 2014/0098492 A1* | 4/2014 | Lam | H05K 7/20727 361/692 |
| 2014/0146471 A1* | 5/2014 | Liu | H05K 7/20727 361/695 |
| 2014/0152446 A1* | 6/2014 | Aruga | H05K 7/20727 340/603 |
| 2014/0168887 A1* | 6/2014 | Lai | H05K 7/20736 361/679.46 |
| 2014/0177164 A1* | 6/2014 | Stewart | H05K 7/20145 361/679.46 |
| 2014/0233173 A1* | 8/2014 | Matsushita | H05K 7/20745 361/679.46 |
| 2014/0355201 A1* | 12/2014 | Alshinnawi | H05K 7/20736 361/679.47 |
| 2015/0009624 A1* | 1/2015 | Dunwoody | F28F 9/007 361/688 |
| 2015/0065028 A1* | 3/2015 | Krietzman | H05K 7/20736 454/184 |
| 2015/0147954 A1* | 5/2015 | Marrs | H05K 7/20736 454/284 |
| 2015/0181747 A1* | 6/2015 | Bailey | H05K 7/20736 361/679.48 |
| 2015/0264837 A1* | 9/2015 | Clidaras | H05K 7/20745 165/287 |
| 2015/0289417 A1* | 10/2015 | Peng | H05K 7/20 361/679.5 |
| 2015/0334873 A1* | 11/2015 | Maeda | H05K 7/20181 361/690 |
| 2016/0050796 A1* | 2/2016 | Mayenburg | H05K 5/0213 361/679.48 |
| 2016/0081220 A1* | 3/2016 | Chia | F24F 7/007 361/692 |
| 2016/0106009 A1* | 4/2016 | Slessman | F28F 9/0265 361/679.47 |
| 2016/0128226 A1* | 5/2016 | Stellick | H05K 7/20727 361/679.46 |
| 2016/0135323 A1* | 5/2016 | Haroun | H05K 7/1485 361/679.53 |
| 2016/0165760 A1* | 6/2016 | Kutsuzawa | H05K 7/20736 361/679.5 |
| 2016/0183413 A1* | 6/2016 | Roesner | G06F 1/20 361/679.48 |
| 2016/0330873 A1* | 11/2016 | Farshchian | G06F 1/20 |
| 2018/0035571 A1* | 2/2018 | Grinberg | H05K 7/20836 |
| 2018/0054923 A1* | 2/2018 | Bryan | G06F 1/20 |
| 2018/0070475 A1* | 3/2018 | Ross | H05K 7/20727 |
| 2018/0124955 A1* | 5/2018 | Rogers | H05K 7/20745 |

* cited by examiner

AIR DUCT FOR COOLING A REAR-MOUNTED SWITCH IN A RACK

BACKGROUND

In a typical data center environment, a server rack is positioned between a hot aisle and a cold aisle to achieve a higher cooling efficiency. In the typical configuration, the ambient air temperature is cool at the front of the rack and is hot at the rear of the rack, with the air temperature between the cold and hot aisles showing a gradient between the two, but generally considered to be a "warm" zone.

For rack-mounted servers with cold air intakes on the front of the rack, the typical arrangement is optimal for providing cool air to the server from the cold aisle and for exhausting heated air from the server to the hot aisle.

However, because of design and other layout limitations, many rack switches are configured to be mounted at the rear of the rack and to use side inlet air for cooling. Such rack switches also exhaust air toward the front of the rack. This typical data center environment causes at least two problems regarding such rack switches. First, the air used for cooling the rack switch is taken from the warm zone, which is not optimal for cooling the rack switch. And second, the heated exhaust air created by the rack switch is exhausted toward the front of the rack—into the cold aisle—which is not optimal for cooling the rack-mounted servers because it mingles with the cold aisle air and increases its temperature. And when servers operate at higher temperatures they consume more power because they increase fan speeds in response to increased operating temperature.

Some solutions may: provide cooling air to switches from the hot aisle or warm zone and exhaust hot air to the cold aisle (as described above); or use two rack units (2 U) of space. The first solution is undesirable for the reasons just discussed. The 2 U solution is undesirable because it uses twice the rack space—two slots of the rack. In the 2 U solution the first slot is taken by the switch and the second slot is taken by a duck that re-directs heated exhaust air over the top of the rack switch and toward the hot aisle at the rear of the rack.

Therefore, the need exists for a solution that doesn't require a second rack slot, that provides air from the cold aisle for cooling the rack switch, and that diverts the rack switch's heated exhaust air away from the cold aisle.

DETAILED DESCRIPTION

In an embodiment, a ducting apparatus that fits one rack slot enables a rack switch to receive air from the cold aisle and diverts heated exhaust from the rack switch towards one or both sides of the rack.

Figure 4:
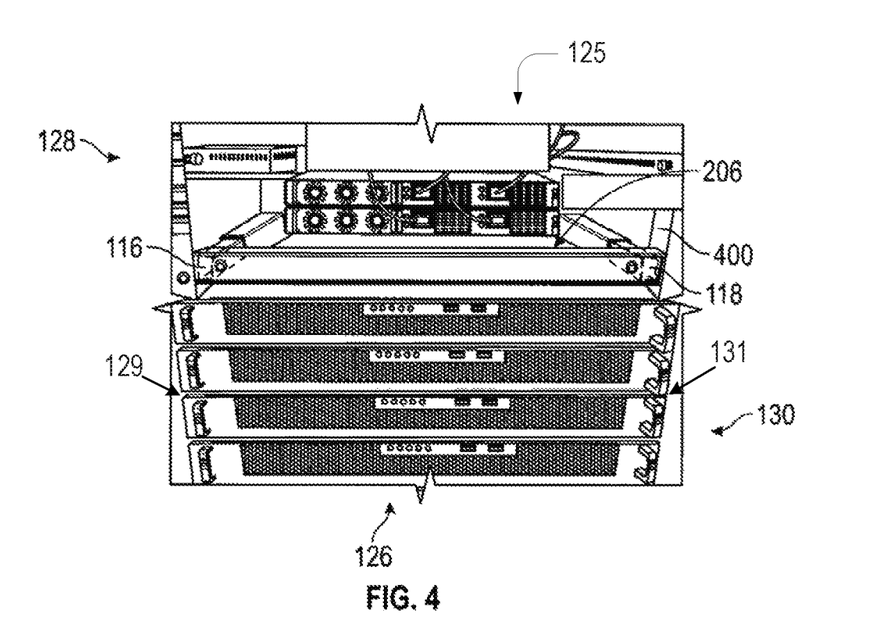
FIG. 4 is a perspective drawing illustrating a ducting apparatus and electronic device of an embodiment.

In an embodiment, a ducting apparatus is configured to be combined with a rack and an electronic rack-mounted device, such as a rack switch. The ducting apparatus is configured for a rack that is between a cold aisle 126 (FIG. 4, also known as "cold zone 126") and a hot aisle 125 (FIG. 4). As a result, sides 129 (FIG. 4), 131 (FIG. 4) of the rack are in warm zones 128 (FIG. 4), 130 (FIG. 4) between the cold and hot aisles 126, 125, respectively, with a face 127 (FIG. 4) bordering cold aisle 126 (FIG. 4). The ducting apparatus is also configured for an electronic device, such as a rack-switch, that is mounted in the rack such that it has a cold air intake at the side of the rack (in warm zone 128 or 130) and a heated air exhaust directed toward the cold aisle 126. Adding heated exhaust air to cold aisle 126 is undesirable. And placing a cold air intake in a zone with warm air (e.g., warm zone 128 or 130) is also less than optimal. To improve this situation, the ducting apparatus of the embodiment is configured to provide a conduit for cooling air to flow from cold aisle 126 to the side inlet of the electronic device. The ducting apparatus is also configured to block, at least partially, the heated exhaust air from reaching cold aisle 126. In blocking the exhaust air, the ducting apparatus may re-direct it toward one or both sides 129, 131 of the rack—into the warm zone(s) 128, 130. In the embodiment, the ducting apparatus is configured so that, when installed in the rack with the electronic device, the ducting apparatus includes a first duct section that is provided with an inlet port and an outlet port. The inlet port has access to air on the cold-aisle side (face 127 (FIG. 4)) of the rack and the outlet port is positioned near the cold air inlet of the electronic device, which is on the side of the electronic device in the warm zone. The ducting apparatus thus directs air from cold aisle 126 to the cold-air intake in the rack-mounted electronic device. The embodiment includes a face plate positioned between cold aisle 126 and the heated exhaust to block, at least partially, the heated exhaust air from reaching cold zone 126 and to re-direct the exhaust air toward sides 129, 131 of the rack.

In an embodiment, the ducting apparatus is combined with the electronic device.

In an embodiment, the ducting apparatus and the electronic device are combined with the rack, with the electronic device being sandwiched between upper and lower electronic devices. The ducting apparatus is configured for the slot between the upper and lower electronic devices. In the embodiment, the face plate, upper electronic device, and lower electronic device cooperate to block exhaust air from reaching the cold zone and re-direct the exhaust air toward the sides of the rack.

Figure 1:
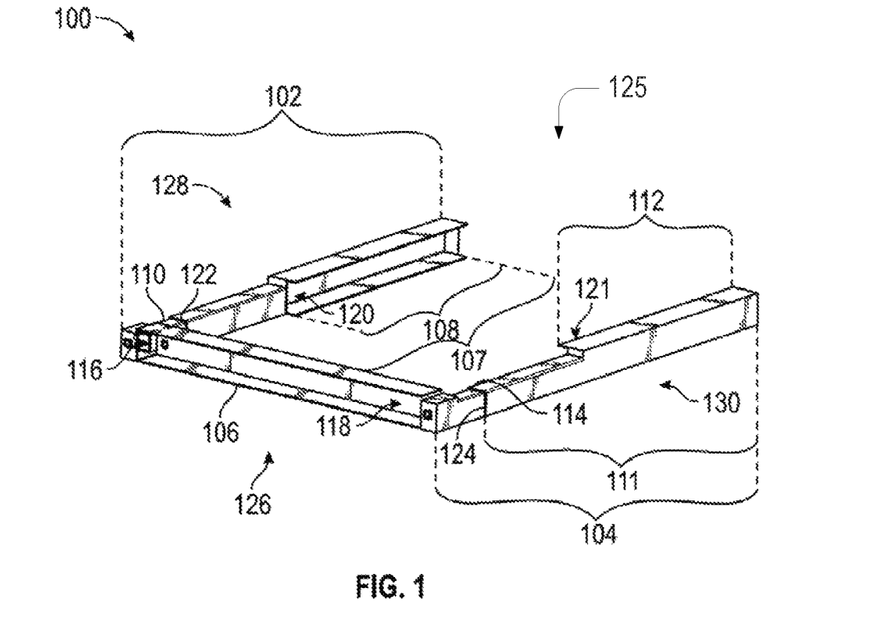
FIG. 1 is a perspective drawing illustrating a ducting apparatus of an embodiment.

FIG. 1 is a perspective drawing illustrating a ducting apparatus 100 of an embodiment. In FIG. 1, ducting apparatus 100 includes duct sections 102, 104. Duct section 102 includes a trunk section 110 and a main section 107. Trunk section 110 telescopes within main section 107 at telescoping connection 122, allowing the length of duct section 102 to be changed. Main section 107 includes a shield 108 and a port 120. Trunk section 110 includes a port 116. Trunk section 110 and main section 107 are hollow and allow air to flow between ports 116 and 120. Shield 108 is positioned about switch 200 (FIG. 2) to direct the flow of air to a side air inlet (not shown) on that side of switch 200. Similar to duct section 102, duct section 104 includes a trunk section 114 and a main section 111. Trunk section 114 telescopes within main section 111 at telescoping connection 124, allowing the length of duct section 104 to be changed. Main section 111 includes a shield 112 and a port 121 (hidden due to the perspective). Trunk section 114 includes a port 118

(hidden due to the perspective). Trunk section 114 and main section 111 are hollow and allow air to flow between ports 118 and 121. Shield 112 is positioned about switch 200 (FIG. 2) to direct the flow of air to a side air inlet (not shown) on that side of switch 200. The air inlets may be anywhere on the sides of switch 200, and shields 108 112 may be adjusted in their dimensions so that shields 108, 112 may cover just the air inlet. Furthermore, only one side of switch 200 may be equipped with an air inlet. In such cases, only one duct section (102 or 104) and a face plate 106 (also called "front plate 106") may be needed to obtain the benefits of cooling switch 200 with air from cold zone 126 and diverting heated exhaust air to warm zones 128 and 130.

Figure 5:
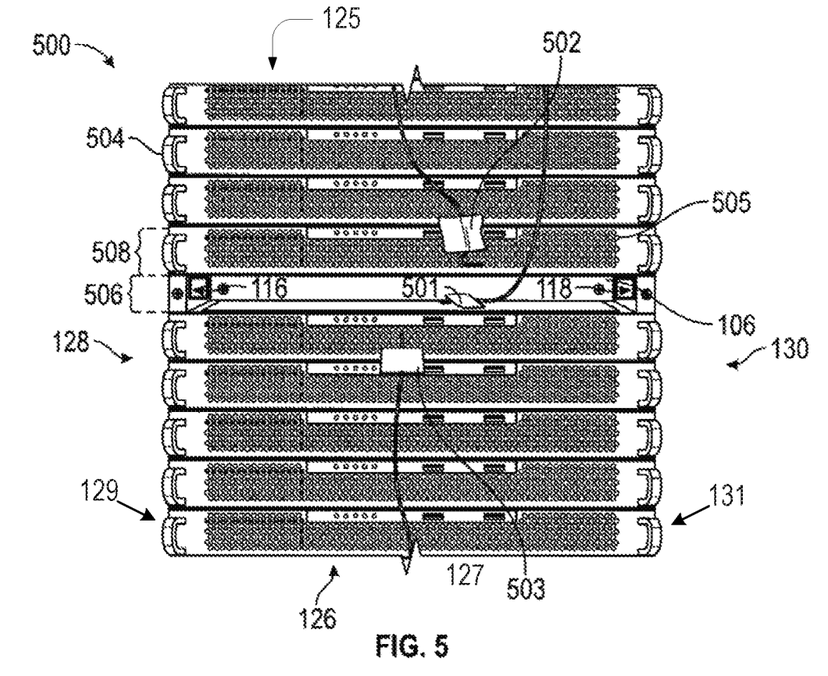
FIG. 5 is a perspective drawing illustrating a ducting apparatus and electronic device of an embodiment.

Ducting apparatus 100 also includes a front plate 106 that is positioned between duct sections 102 and 104. When installed on switch 200 (FIG. 2) in a rack 504 (FIG. 5), ducting apparatus 100 may be oriented with front plate 106 toward a cold aisle 126. Front plate 106 then separates ports 116, 118 from exhaust area 206 (FIG. 2), allowing ports 116, 118 to access the air of cold aisle 126 at the front of the rack-mounted system 500 (FIG. 5). Front plate 106 works to keep exhaust air from switch 200 from mingling with, and thereby increasing the temperature of, the air in cold aisle 126. With rack 504 (FIG. 5) oriented with front plate 106 facing cold aisle 126, duct sections 104, 102 face warm zones 128, 130 respectively.

Figure 2:
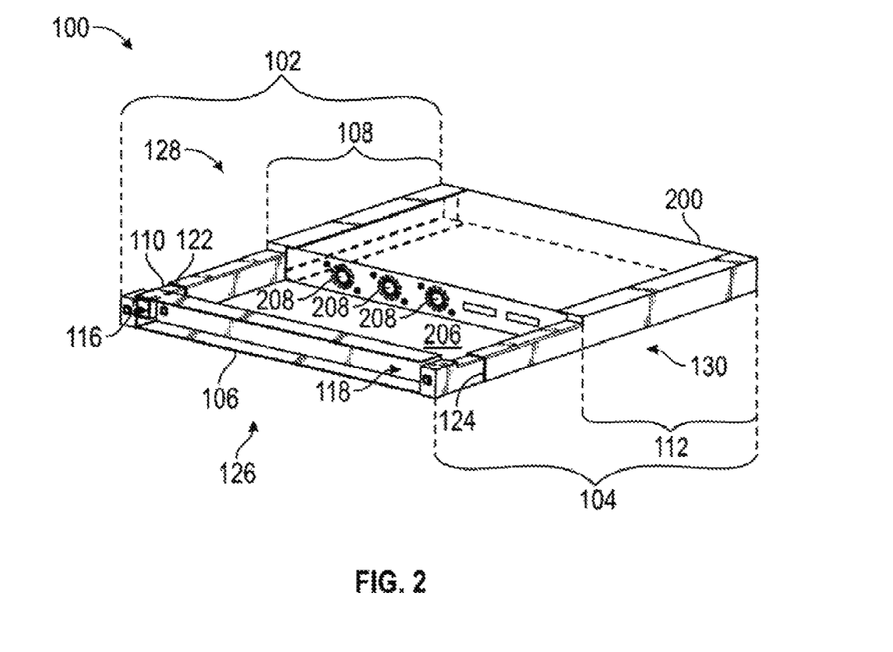
FIG. 2 is a perspective drawing illustrating a ducting apparatus and electronic device of an embodiment.

FIG. 2 is a perspective drawing illustrating a ducting apparatus 100 combined with a switch 200 of an embodiment. Ducting apparatus 100 and switch 200 are configured to be mounted in rack 504 (FIG. 5) with switch 200 at the rear of rack 504. Switch 200 has side air inlets for receiving cooling air, either on one or both sides of switch 200. Fans 208 exhaust heated air into an exhaust area 206. Exhaust air is hindered from flowing directly into cold aisle 126 by face plate 106. In an embodiment, face plate 106 may be shaped, e.g., curved or v-shaped, with the shape causing exhaust from fans 208 to be diverted to sides 128, 130

Duct sections 102, 104 are attached to switch 200 with shields 108, 112. For example, shield 108 attaches to switch 200 and lines up with server edges 202, 204. With duct sections 102, 104 attached in this manner, duct sections 102, 104 provide a pathway for air to flow between ports 116, 118 and the air inlet on the respective side. These pathways also prevent the side air inlets from having access to air from warm zones 128, 130.

The telescoping feature of duct sections 102, 104 enables ducting apparatus 100 to be used for switches that mount in different fore/aft locations of a slot in rack 504. In other words, ducting apparatus 100 may by extended or retracted to accommodate situations where a switch (or the air inlet for a switch) is located closer to or further from the face of rack 504.

In the embodiment shown in FIG. 2, shields 108, 112 are configured to cover the entire side of switch 200.

In an embodiment, shields 108, 112 may be configured to cover only the sides of switch 200 immediately around an air inlet.

In an embodiment, the location of ports 120, 121 may be extended and placed so near to an air inlet that shields 108, 112 are not necessary to get air from cold aisle 126 to the air inlet. In this embodiment, shields 108, 112 may be eliminated.

Figure 3A:
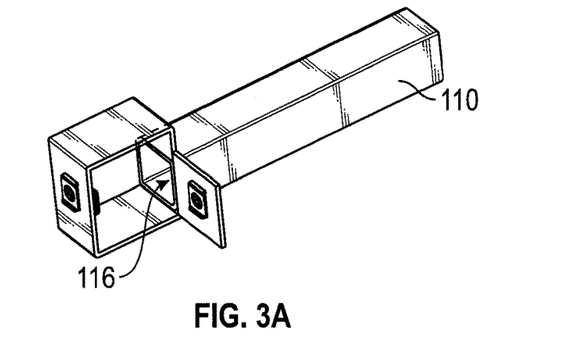
FIGS. 3A-3F are perspective drawings illustrating embodiments and the assembly of embodiments.
Figure 3B:
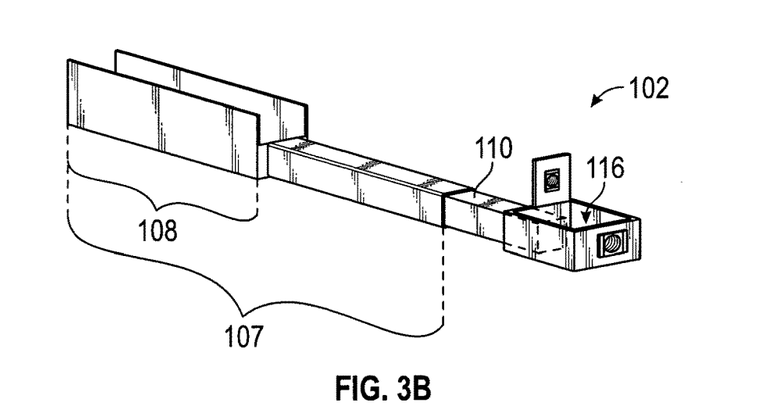
Figure 3C:
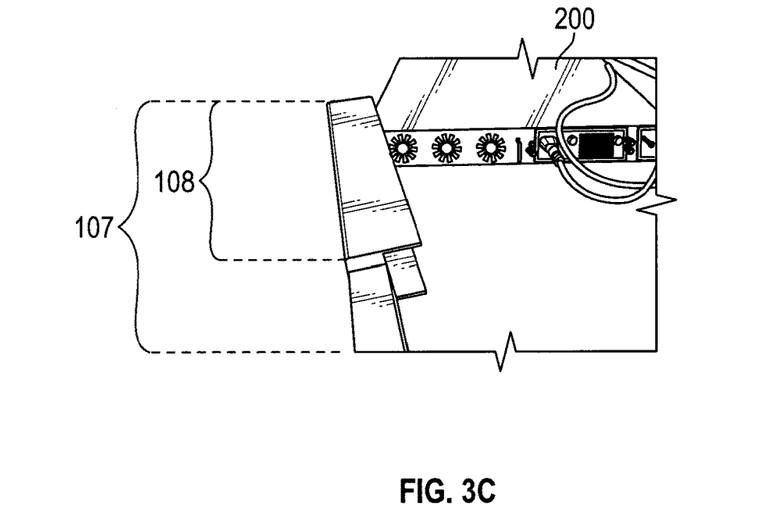
Figure 3D:
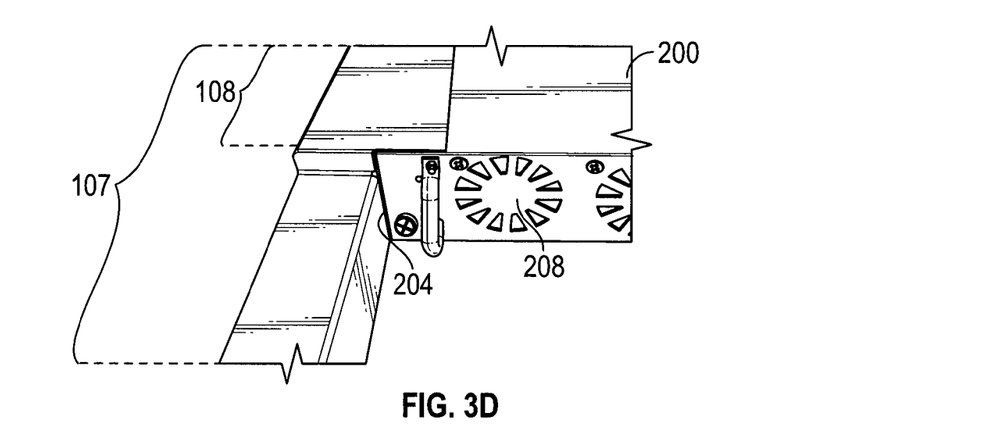
Figure 3E:
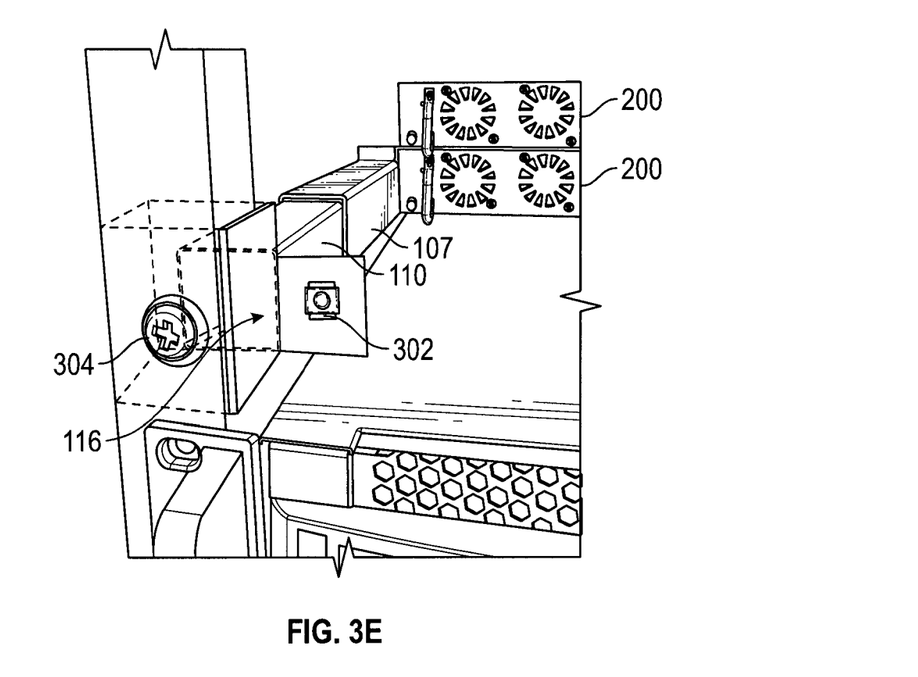
Figure 3F:
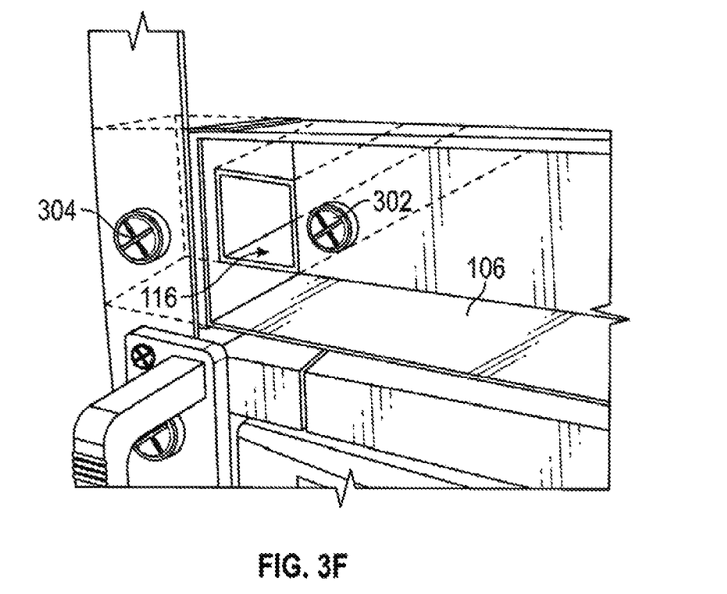

FIGS. 3A-3E are perspective drawings illustrating embodiments and the assembly of embodiments, concentrating on duct section 102. The assembly of duct section 104 with switch 200 would be similar. FIG. 3A shows port 116, through which air may enter trunk section 110. FIG. 3B shows trunk section 110 inserted into main section 107. Trunk section 110 and main section 107 may telescope at telescoping connection 122 to change the overall length of duct section 102. Main section 107 and trunk 110 create a conduit for air to pass between ports 116 and 120. FIG. 3C shows the beginning of assembling duct section 102 and switch 200. In FIG. 3C, shield 108 has been partly moved into position about switch 200. In FIG. 3D, shield 107 is shown in place about switch 200, with the edge of shield 107 lined up with server edge 204. In FIG. 3E, duct section 102 and switch 200 are shown installed in a rack slot 506 of rack 504 (FIG. 5). Rack slot 506 is one rack unit tall. The rack unit below duct section 102 is filled with a server, but a rack slot 508 (FIG. 5) above is, as yet, unpopulated. Connector 304, typically a threaded insert/bolt combination, is used to attach trunk 110 to rack 504 (FIG. 5). Connector 302, also typically a threaded insert/bolt combination, will be used for attaching face plate 106 to trunk 110. FIG. 3F shows face plate 106 connected to trunk 110 using connector 302. FIG. 3F shows port 116 in more detail—port 116 does not open directly onto cold aisle 126. Still, face plate 106 and the orientation of port 116 cooperate to give port 116 access to air from cold aisle 126, rather than access to air from exhaust area 206 (FIG. 2).

FIG. 4 is a perspective drawing illustrating a ducting apparatus 100 and switch 200 of an embodiment. In FIG. 4, both duct sections 102, 104 have been installed in rack 400 (see also rack 504, FIG. 5) with face plate 106 connected to both. The inward orientation of ports 116, 118 may be beneficial in drawing air from cold aisle 126, rather than from warm zones 128, 130, respectively. FIG. 4 clearly shows that exhaust from fans 208 headed toward cold zone 126 would be blocked by face plate 106.

FIG. 4 shows ducting apparatus 100 and switch 200 atop a server. However, circumstances may drive switch 200 to be rack-mounted where no server is below the switch. In an embodiment, ducting apparatus 100 functions to support switch 200. In the embodiment, shields 108, 112 grasp switch 200 and also may attach to the rear of rack 504, thereby supporting switch 200 within rack 504. This embodiment may be used even when a server is available for support below the switch, since mounting a switch in ducting apparatus 100 may create a space between switch 200 and a server, which may improve cooling.

FIGS. 3A-3E and FIG. 4 illustrate a further benefit of ducting apparatus 100—it may be installed from the front of rack 504. That is, it is not necessary to have access to the back or sides of rack 504 in order to install ducting apparatus 100. Neither is it necessary to move rack 504 in order to install ducting apparatus 100. Similarly, FIGS. 3A-3E and FIG. 4 illustrate that the connections to switch 200 do not need to be disturbed when installing ducting apparatus 100. For this reason, switch 200 may remain powered and completely connected when installing ducting apparatus 100.

In an embodiment, a switch may have it air inlets on only one side. In such case, only one of duct sections 102, 104 may be needed, with the unnecessary duct section being eliminated. In the embodiment, face plate 106 is still included to block exhaust gas from reaching cold aisle 126. The exhaust gas would then easily exhaust to the warm zone on the side of the eliminated duct section.

FIG. 5 is a perspective drawing illustrating an embodiment of a rack system 500 with ducting apparatus 100, switch 200 (FIG. 2), and rack 504. In FIG. 5, rack slot 508 has been filled with a server 505. Thus, exhaust area 206 (FIG. 2), which was previously shown open to rack slot 508 (see FIG. 4) is now bounded top and bottom by servers, bounded on each side by duct sections 102, 104, and bounded in front by face plate 106. Being bounded on top, on bottom, and in front, air from fans 208 is prevented or hindered from reaching cold aisle 126. It may be that some air from exhaust area 206 reaches cold aisle 126. This may occur by way of leakage between, for example, face plate 106 and the servers above and below, or by the air flowing into warm zones 128, 130 and from there into cold aisle 126. For ducting apparatus 100 to be effective, it is not necessary to completely eliminate the possibility that air from exhaust zone 206 may eventually reach cold aisle 126.

FIG. 5 and the multitude of servers above and below ducting apparatus 100 in rack slot 506 illustrate a benefit of ducting apparatus 100—ducting apparatus 100 is only one rack unit tall. Compared to solutions that are two rack units tall, ducting apparatus 100 allows an additional server to be mounted in each rack.

In FIG. 5, thermocouples 501, 502, and 503 have been positioned on faceplate 106 (thermocouple 501) and on the face of servers (thermocouples 502, 503). These thermocouples were used for an experiment, which will be discussed after the discussion of FIG. 6.

Figure 6:
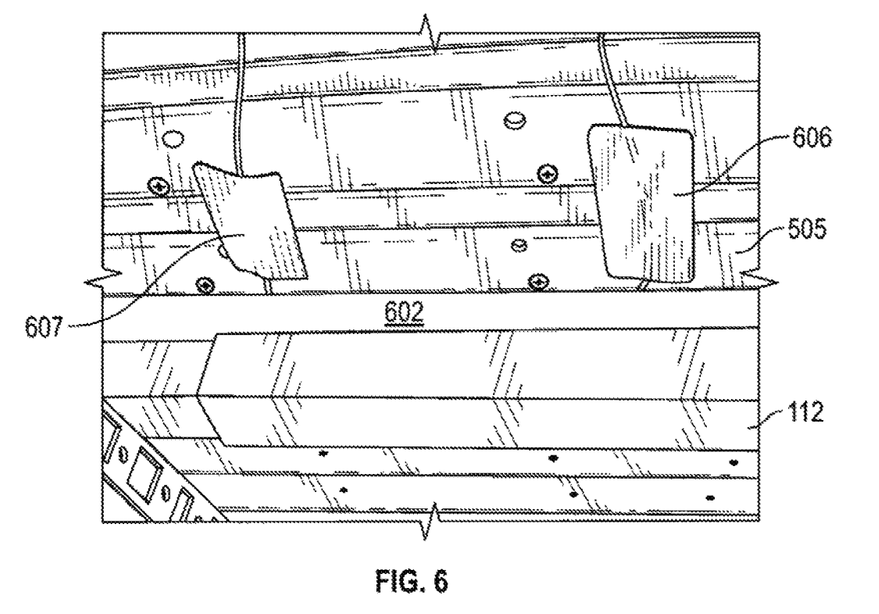
FIG. 6 is a perspective drawing illustrating a ducting apparatus and electronic device of an embodiment.

FIG. 6 is a perspective drawing illustrating an embodiment of a rack system 500 (FIG. 5) with a ducting apparatus 100 (FIG. 1), switch 200 (FIG. 2), and rack 504. With ducting apparatus 100 installed in rack 504 and server 505 installed above and another server installed below ducting apparatus 100, a gap 602 is created. Gap 602 may result from the height of main section 111 being less than one rack unit in height in some part of the region where main section 111 is next to exhaust area 206. With main section 111 less than one rack unit in height, air from exhaust area 206 may flow between main section 111 and the server above or below. Gap 602 also may result from main section 111 being offset, from the side of the servers above and below. Thus, even if main section 111 were one rack unit in height, the offset would create a gap allowing air to escape exhaust air 206—air could escape by flowing horizontally until blocked by main section 111 and then vertically (up or down) through the gap created by the offset.

Regarding gap 602 and the escaping of air from exhaust area 206, the general idea is to make it easier for air to escape to warm zones 128, 130 than to escape to cold aisle 126. In other words, the duct sections 102, 104 should be configured to hinder the movement of air into warm zones 128, 130 less than face plate 106 hinders the movement of air into cold aisle 126.

FIG. 6 allows further discussion of how embodiments solve the problems a typical data center environment creates for a rack switch. The first problem, that the air used for cooling the rack switch is from the warm zone, is alleviated by duct sections 102, 104 conveying air from cold aisle 126 to the side air inlets. And the second problem, that heated exhaust air created by the rack switch is exhausted toward the cold aisle, is alleviated by face plate 106 blocking the path to the cold aisle and by gap 602 providing a path for the exhaust air to flow into the warm zone.

In FIG. 6, thermocouples 606, 607 are positioned above gap 602 through which air from exhaust area 206 exits rack 504. Like thermocouples 501, 502, 503, thermocouples 606, 607 were used for an experiment, which will now be discussed.

EXPERIMENTAL RESULTS

Tests were conducted on rack system 500. The particular rack system was a ZT 1 U server rack and a rack-switch 200 (FIG. 2) with and without ducting apparatus 100 (FIG. 1). In short, the test results show that both server and switch inlet air temperatures were significantly decreased using ducting apparatus 100.

In the tests, a 1 U switch 200 (FIG. 2) was mounted in rack slot 506 as shown in FIG. 5. Thermocouples TC#1 501, TC#2 502, and TC#3 503 were placed to measure the temperatures at the server air inlets (502, 503) and at the switch air inlet (501). That is, TC#1 501 measured temperature at face plate 106 in the slot of switch 200. TC#2 502 measured the temperature measurement at the air inlet to the server in the slot above switch 200. And TC#3 503 measured the temperature at the air inlet to the server in the slot below switch 200. As discussed, switch 200 was mounted in the rear of rack 504 and blew exhaust toward the front of rack 504. FIG. 6 shows TC#6 606 and TC#7 607, which measured the temperature on the right side of the server in rack slot 508, above gap 602. TC#6 606 and TC#7 607 were on the side of warm zone 130. Similarly placed on the other side of the server, TC#4 (not shown) and TC#5 (not shown) measured the temperature on the left side of the server in rack slot 508. TC#4 (not shown) and TC#5 (not shown) were on the side of warm zone 128. Thus, TC## 4-7 measured the temperature of air above the gaps through which air escaped exhaust area 206.

Table 1, below, contains the test results—the temperatures measured by the thermocouples with, and without, ducting apparatus 100. The tests were performed in similar ambient temperature, as shown in Table 1 by TC#8 (not shown in figures, but which measured the temperature of the cold aisle).

TABLE 1

| Thermocouple location | Measured temperature (° C.) | |
| --- | --- | --- |
| | With air-duct | Without air-duct |
| TC#1, Front rack on switch slot | 22.6 | 37.0 |
| TC#2, Front rack on server slot | 21.0 | 31.6 |
| TC#3, Front rack on server slot | 20.5 | 29.8 |
| TC#4, Left side rack on switch slot | 35.5 | 25.9 |
| TC#5, Left side rack on switch slot | 36.2 | 30.2 |
| TC#6, Right side rack on switch slot | 35.2 | 25.2 |
| TC#7, Right side rack on switch slot | 33.3 | 25.8 |
| TC#8, Ambient temperature | 20.5 | 20.8 |

Without ducting apparatus 100, the temperatures measured by TC#1 501, TC#2 502, and TC#3 503 at the front of the rack are significantly higher than those measured with ducting apparatus 100 (37.0, 31.6, and 29.8 versus 22.6, 21.0, and 20.5). In other words, using ducting apparatus 100 caused the air inlet temperature for the servers above and below ducting apparatus 100 to drop by approximately 10° C.

Comparing the temperatures of TC#4, TC#5, TC#6 606 and TC#7 607 shows a temperature rise with the addition of ducting apparatus 100. This indicates that exhaust hot air was blocked by front plate 106 and escaped through gap 602. These thermocouples also indicate that switch 200 may have benefited from ducting apparatus 100. Without ducting apparatus 100, switch 200 has side cold air inlets that face warm zones 128, 130. The test results indicate that, without ducting apparatus 100, the side temperatures ranged from 25.2 to 30.2. However, with ducting apparatus 100, the side cold air inlets received air from the face, which was 22.6 at TC#1 501 in the middle of face plate 106. This testing highlights one of the benefits of ducting apparatus 100, it channels air from cold aisle 126 to the side air inlets to optimize the performance of the switch thermal system.

The examples and embodiments in this disclosure may generally reference the ducting apparatus 100 providing cool air to the rack switch 102. However, reference to rack switch 102 or simply switch 102 is merely exemplary—it is representative of any electronic device that may be accommodated by a rack and which may have side cooling air inlets and which may exhaust heated air toward the front of the rack.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. For example, one skilled in the art will recognize that these embodiments can be practiced without one or more of the specific details, or with other components, systems, etc. And, in other instances, there may be structures or operations not shown, or not described in detail, to avoid obscuring aspects of the described embodiments. Therefore, the scope of the appended claims should be accorded the broadest interpretation so as to encompass all such modifications and similar arrangements.

What is claimed is:

1. An apparatus for providing cooling air to a first air inlet of a first electronic device installed on a rack, the first air inlet being disposed on a first side of the first electronic device and the first electronic device directing a first exhaust toward a first face of the rack, the apparatus comprising:
   a first duct section provided with a first port and a second port, the first duct section configured to position the first port with access to the cooling air at the first face of the rack and the first duct section configured to position the second port in proximity to the first side of the first electronic device such that the first air inlet of the first electronic device has access to the cooling air from the second port;
   a shield configured to conduct the cooling air from the second port to the first air inlet and including a lower shield element supporting the first side of the first electronic device from below and an upper shield element, the upper and lower shield elements receiving the first side of the first electronic device between the upper and lower shield elements; and a face plate positioned between the first electronic device and the first face, the face plate hindering the first exhaust from reaching the first face.

2. The apparatus of claim 1, the first side of the first electronic device having a length, the shield being configured to receive substantially the length of the first side of the first electronic device and configured such that the first air inlet has access to the cooling air from the first port when the first air inlet is located anywhere on the received part of the first side of the first electronic device.

3. The apparatus of claim 1, the first duct section further comprising a first part and a second part, the first part telescoping with the second part to change a distance between the first port and the second port.

4. The apparatus of claim 1, the first electronic device for which the apparatus is configured being a switch.

5. The apparatus of claim 4, the first face of the rack for which the apparatus is configured facing a cold aisle providing the cooling air and the first side and a second side of the switch for which the apparatus is configured facing zones that are warmer than the cold aisle.

6. The apparatus of claim 5, the switch for which the apparatus is configured occupying less than a full depth of a slot of the rack and directing the exhaust toward the cold aisle.

7. An apparatus for providing cooling air to a first air inlet of a first electronic device installed on a rack, the first air inlet being disposed on a first side of the first electronic device and the first electronic device directing an exhaust toward a first face of the rack, the apparatus comprising:
   a first duct section provided with a first port and a second port, the first duct section configured to position the first port with access to the cooling air at the first face of the rack and the first duct section configured to position the second port in proximity to the first side of the first electronic device such that the first air inlet of the first electronic device has access to the cooling air from the second port;
   a second duct section provided with a third port and a fourth port, the second duct section configured to position the third port with access to the cooling air at the first face of the rack and configured to position the fourth port at a second side of the first electronic device, a second air inlet of the first electronic device being disposed on the second side of the first electronic device;
   a first shield configured to conduct the cooling air from the second port to the first air inlet and including a lower shield element supporting the first side of the first electronic device from below and an upper shield element, the upper and lower shield elements receiving the first side of the first electronic device between the upper and lower shield elements;
   a second shield configured to conduct the cooling air from the fourth port to the second air inlet and including a lower shield element supporting the first side of the first electronic device from below and an upper shield element, the upper and lower shield elements receiving the first side of the first electronic device between the upper and lower shield elements;
   a face plate positioned between the first electronic device and the first face and between the first port and the third port such that the face plate hinders the exhaust from reaching the first face and such that a space is defined by the first duct section, the face plate, the second duct section, the first electronic device, a second electronic device, and a third electronic device, the first electronic device being disposed between the second electronic device and the third electronic device, the exhaust from the first electronic device being directed into the space; and at least one of:
     the first duct section further configured to hinder movement of the exhaust through the plane of the first side less than the face plate hinders movement of the exhaust through the plane of the first face; or
     the second duct section further configured to hinder movement of the exhaust through the plane of the second side less than the face plate hinders movement of the exhaust through the plane of the first face.

8. The apparatus of claim 7, a height of the face plate being equal to a height of a first slot of the rack and wherein at least one of:
   a height of a part of the first duct section that is adjacent the defined space is less than the height of the face plate; or a height of a part of the second duct section that is adjacent the defined space is less than the height of the face plate.

9. The apparatus of claim 7, the first duct section further comprising a first part and a second part, the first part telescoping with the second part to change a distance between the first port and the second port, and the second duct section further comprising a third part and a fourth part, the third part telescoping with the fourth part to change a distance between the third port and the fourth port.

10. The apparatus of claim 7, the first electronic device for which the apparatus is configured being a switch.

11. The apparatus of claim 10, the first face of the rack for which the apparatus is configured facing a cold aisle providing the cooling air and the first side and a second side of the switch for which the apparatus is configured facing zones that are warmer than the cold aisle.

12. The apparatus of claim 11, the second and third electronic devices each being a server taking the cooling air from the cold aisle and directing server exhaust air toward a hot aisle.

13. The apparatus of claim 11, the switch for which the apparatus is configured occupying less than a full depth of a slot of the rack and directing the exhaust into the defined space.

* * * * *